United States Patent
Hosoya et al.

(10) Patent No.: US 9,159,530 B2
(45) Date of Patent: Oct. 13, 2015

(54) ELECTRON MICROSCOPE SAMPLE HOLDER AND SAMPLE OBSERVATION METHOD

(75) Inventors: Kotaro Hosoya, Hitachinaka (JP); Masaomi Ohno, Hitachinaka (JP); Haruhiko Hatano, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/002,056

(22) PCT Filed: Oct. 28, 2011

(86) PCT No.: PCT/JP2011/075001
§ 371 (c)(1),
(2), (4) Date: Sep. 20, 2013

(87) PCT Pub. No.: WO2012/120726
PCT Pub. Date: Sep. 13, 2012

(65) Prior Publication Data
US 2014/0014835 A1   Jan. 16, 2014

(30) Foreign Application Priority Data
Mar. 4, 2011  (JP) .................................. 2011-047069

(51) Int. Cl.
*H01J 37/20* (2006.01)
*H01J 37/28* (2006.01)

(52) U.S. Cl.
CPC ............. *H01J 37/20* (2013.01); *H01J 37/28* (2013.01); *H01J 2237/2001* (2013.01); *H01J 2237/2003* (2013.01)

(58) Field of Classification Search
CPC ......... H01J 37/20; H01J 37/26; H01J 37/261; H01J 2237/004; H01J 2237/0041; H01J 2237/0044; H01J 2237/006; H01J 2237/20; H01J 2237/2002; H01J 2237/2003; H01J 2237/2004; H01J 2237/26; H01J 2237/2605; H01J 2237/2608
USPC ................................ 250/310, 440.11, 441.11
See application file for complete search history.

(56) References Cited

U.S. PATENT DOCUMENTS

| | | | |
|---|---|---|---|
| 4,705,949 A * | 11/1987 | Grimes et al. | 250/440.11 |
| 5,097,134 A | 3/1992 | Kimoto et al. | |
| 6,979,822 B1 | 12/2005 | Stewart et al. | |
| 2005/0279934 A1 | 12/2005 | Stewart et al. | |
| 2009/0242763 A1 * | 10/2009 | Buijsse | 250/307 |

FOREIGN PATENT DOCUMENTS

| | | | |
|---|---|---|---|
| GB | 1477458 A * | 6/1977 | |
| JP | 02-312147 A | 12/1990 | |

(Continued)

*Primary Examiner* — Jack Berman
(74) *Attorney, Agent, or Firm* — Mattingly & Malur, PC (57) ABSTRACT

The present invention makes it possible, even when using an ordinary electron beam device (not an environment-controlled electron beam device), to create locally a low vacuum condition in the vicinity of a sample and cool said sample by means of a sample holder alone, without modifying the device or adding equipment such as a gas cylinder. The sample to be observed is placed in a sample holder provided with: a vessel that can contain a substance to serve as a gas source; and a through-hole in the bottom of a sample mount on said vessel. Via the through-hole, gas evaporating or volatilizing from the vessel is supplied to the sample under observation, thereby creating a localized low-vacuum state at or in the vicinity of the sample. Also, the heat of vaporization required for volatilization can be used to cool the sample.

10 Claims, 9 Drawing Sheets

(56) References Cited

FOREIGN PATENT DOCUMENTS

| JP | 03-165435 A | 7/1991 |
| JP | 08-250057 A | 9/1996 |
| JP | 08250057 A * | 9/1996 |
| JP | 2002-134057 A | 5/2002 |
| JP | 2002-214091 A | 7/2002 |
| JP | 2005-268224 A | 9/2005 |
| JP | 2009-245944 A | 10/2009 |

* cited by examiner

(Magnification: 100,000)

FIG.8B (Magnification: 100,000)

(Magnification: 800)

FIG.11B (Magnification: 800)

FIG.12

ELECTRON MICROSCOPE SAMPLE HOLDER AND SAMPLE OBSERVATION METHOD

FIELD OF THE INVENTION

The present invention relates to a charged particle beam apparatus and especially to a local vacuum technology for the electron microscope to keep in a low vacuum condition a vicinity of a sample onto which an electron beam emitted from an electron gun focuses and is radiated.

DESCRIPTION OF THE RELATED ART

The charged particle beam apparatus radiates charged particles as probing particles on a sample, detects secondary particles generated from the sample or the charged particles that pass through the sample, and obtains information on a probe radiated position on the sample. There are various types of the charged particle beam apparatuses such as a scanning electron microscope (SEM) using electrons as probing particles, a scanning ion microscope (SIM) using ions as probing particles, a focused ion beam apparatus (FIB), and an apparatus into which several apparatuses above mentioned are combined.

In the charged particle beam apparatus such as above mentioned, a sample is placed in a sample chamber in which such a high vacuum atmosphere as has a pressure lower than $10^{-2}$ Pa. The high vacuum atmosphere in the sample chamber is created after the sample chamber is vacuumed to remove gas which blocks probing particles.

When a sample that does not have conductivity is observed with the charged particle beam apparatus as above mentioned, the sample is charged with the particle beam that is being radiated. When the sample is charged, a first charged particle beam is curved, which leads to a drift of the radiated zone and an extraordinary contrast due to charging. As a result information on the surface of the sample is not correctly obtained.

There is a means to keep the sample chamber in a relatively low vacuum atmosphere between several Pa and several thousand Pa and neutralize the charged sample with ions generated from gas molecules colliding with the charged particle beam and the secondary electrons. An atmosphere control type electron beam apparatus making use of this means is actually put into use.

However, the atmosphere control type electron beam apparatus with this means still needs keeping an inside of the electron gun at a high vacuum atmosphere (approximately $10^{-8}$ Pa) even if the sample chamber is kept at a lower vacuum, and accordingly needs to be equipped with a vacuum system having a differential pumping system. Moreover, since the atmosphere control type electron beam apparatus has an entire sample chamber homogeneously kept at a low vacuum, the charged particles beam travels a relatively long distance to pass through the low vacuum zone. As a result, probing particles that are focused while passing through the object lens collide with many gas molecules and are scattered, which results in deterioration of resolution and deterioration of space resolution in X-ray analysis.

Other method to prevent the probing particles from colliding with many gas molecules has been proposed in Patent Document 1. In this method there is provided a nozzle through which gas from an external gas source blown out and the gas is blown out through the nozzle to a zone immediately above a sample to keep the zone at a relatively low vacuum.

Even in the case of the atmosphere control type electron beam apparatus equipped with a multiple differential vacuum pumping system, it is important to suppress probing particles being scattered to improve resolution. Especially when a sample containing water is directly observed, it is necessary to keep a pressure in the sample chamber at about 2000 Pa which is about as high as a saturation vapor pressure. However it is difficult to obtain an image of a high resolution due to the probing particles being scattered. There is other method to prevent the scattering. In this method a cooling stage is installed in the atmosphere control type electron beam apparatus above mentioned and a sample is cooled by the cooling stage to a temperature about as low as 0 degree centigrade to lower the saturation vapor pressure and observed.

PRIOR ART DOCUMENT

Patent Document 1: JP2005-268224A (U.S. Pat. No. 6,979,822)

SUMMARY OF THE INVENTION

Objective to be Achieved

When a sample is charged while a surface of the sample is being observed on a charged particle beam apparatus such as SEM, the resulting sample image could have an extraordinarily high contrast and a probing charged particle beam could shift. There is a method to prevent these abnormalities, in which gas is blown exclusively toward a position on a sample where the probing charged particle beam is radiated.

In order to prevent a sample to be observed from being charged, it is preferable to keep a vicinity of a sample at a vacuum as low as possible and it is necessary to shorten a distance between the sample and an extremity of a nozzle through which gas is blown out. When the distance is shortened, there is a risk that the sample could accidentally collide with the nozzle if the sample is capable of being moved in any direction. In addition, when the sample is moved in the Z direction, a position of the nozzle has to be changed as the sample is moving.

Whichever method is implemented between a method to keep the entire sample chamber at a low vacuum and a method to blow gas to the vicinity of the sample, it is necessary to alter the charged particle beam apparatus or add a medium-sized system inclusive of a mechanism to transfer gas from an external gas source to an inside of the sample chamber, a mechanism to adjust s flow rate of the gas and a mechanism to move the nozzle.

It is possible to prevent a sample containing water from being dried by making use of an atmosphere control type electron beam apparatus and a cooling stage, when the sample just as it is being observed. However, since it is necessary to keep the pressure in the sample chamber at a several hundred Pa if the sample is cooled, it is not possible to prevent probing particles from being scattered and perform observation without an influence of the scattering. Moreover, since the sample is cooled with a Peltier element or cooling water, a medium-sized system is added to a charged particle beam apparatus, which is likely to result in operation of the charged particle beam apparatus becoming complicated.

An objective of the present invention is to provide a charged particle beam apparatus, a sample holder and an sample observation method which more easily enable keeping a vicinity of a sample at a low vacuum while the sample is being cooled than the current charged particle beam apparatus, the current sample holder and the current sample observation method.

Means to Achieve the Objective

The present invention provides a sample holder for the electron microscope that comprises a vessel in which a substance for a gas source can be stored, a cap member which covers the vessel kept in a vacuum and a sample stage having a through hole. A sample to be observed is placed on the sample stage and kept at a low vacuum created by gas that is generated from the gas source evaporating or vaporizing and supplied from the vessel through the through hole to the sample. A low vacuum is created locally at a position where the sample is placed or in the vicinity of the sample. An image of the sample is obtained by radiating an electron beam on the sample kept in the low vacuum atmosphere created as above mentioned.

Effect of the Invention

According to the present invention, it is easier than with the current apparatus to keep exclusively the vicinity of a sample at a low vacuum while the sample is being cooled.

DETAILED DESCRIPTION OF THE EMBODIMENT

Hereinafter are explained in detail examples of scanning electron micro scopes (SEM) to which the present invention is applied as examples of the charged particle beam apparatus.

Example 1

Figure 1:
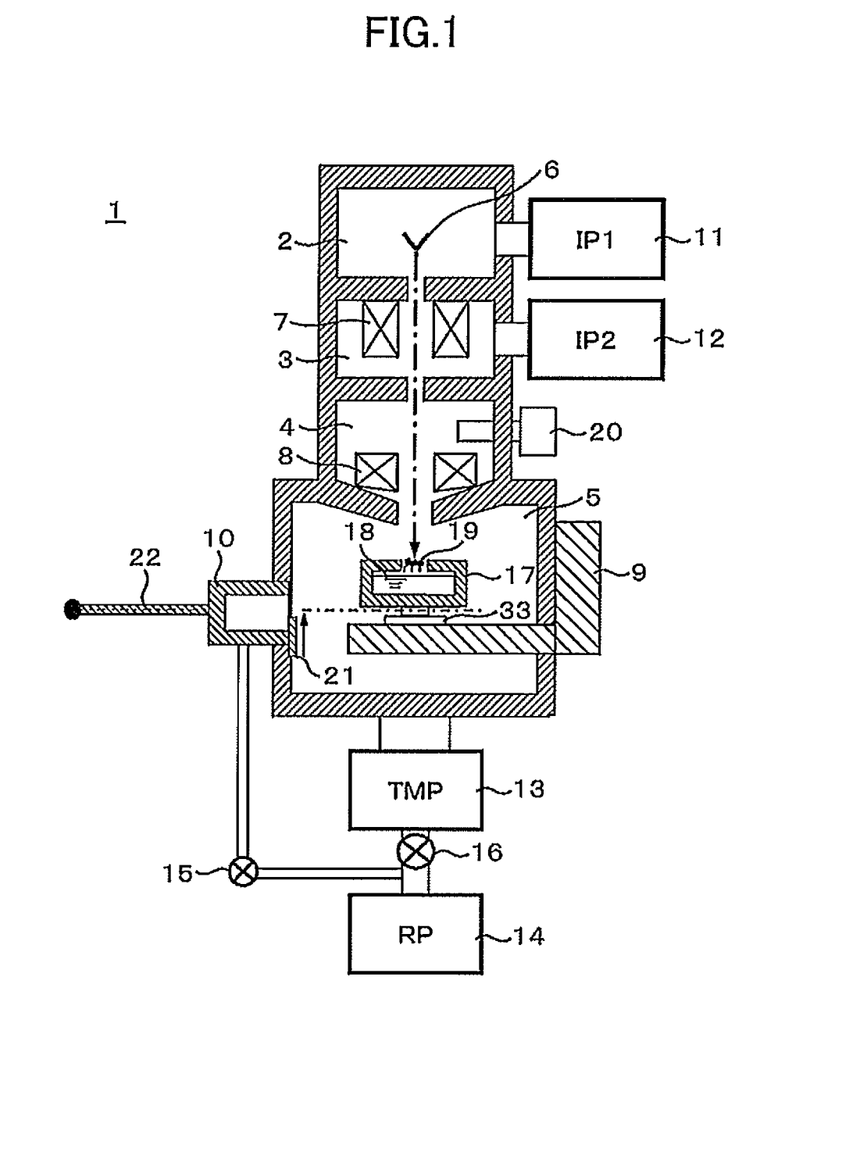
FIG. 1 is a schematic drawing showing a total configuration of a charged particle beam apparatus according to an Example 1.

FIG. 1 a schematic drawing showing a total configuration of a charged particle beam apparatus according to the present example. Roughly speaking, a scanning electron microscope 1 is constituted by an electron gun chamber 2 installed at a top of the scanning electron microscope 1, a focusing lens chamber 3 attached under the electron gun chamber 2, an object lens chamber 4 attached under the focusing lens chamber 2, and a sample chamber 5 attached under the objective lens chamber 4. An electron source 6 is installed in the electron gun chamber 2. A focusing lens 7 is installed in the focusing lens chamber 3. An object lens 8 is installed in the object lens chamber 4. In addition, a secondary electron detection device 20 to detect secondary electrons generated from a sample is installed in the object lens chamber 4 as well.

In the sample chamber 5 are installed a driving mechanism to move a sample in XYTZR directions and a sample replacement chamber 10 through which a sample or the like is taken out of and put into a sample chamber 5 without the sample chamber 5 is exposed to the atmosphere. The driving mechanism corresponds to a sample fine movement device 9 including a XY stage, an inclination stage (T stage), a height stage (Z stage) and a rotation stage (R stage). Each chamber is connected with a vacuum pumping system (for example, ion pumps 11, 12, a turbo-molecular pump 13 and a rotary pump 14) and can be kept at an extremely high vacuum or at a high vacuum corresponding to a pressure lower than the atmosphere pressure.

On the sample fine movement device 9 is placed a sample holder 17 which is filled with a gas source 18 (for example, water). If the gas source is water, the gas source vaporizes at about 2000 Pa and becomes water vapor. In addition, water vapor includes oxygen and is useful for removing contamination. When an internal pressure of the sample holder 17 decreases to about 2000 Pa as a pressure in the sample chamber 5 being vacuumed by the turbo-molecular pump 13 decreases, water vaporizes to be water vapor to come out through a through hole disposed in the sample holder 17. A material on which any type of gas adsorbs easily releases the vaporized or sublimed gas and may be used for a gas source 18 as an alternative to water.

Inside the sample holder 17 there is a flow passage formed to have gas coming out through the through hole introduced to a sample 19 and create a low vacuum condition locally (that is, enabling a higher pressure in the vicinity of the sample than the internal pressure of the sample chamber). As a result, it is possible to obtain an image for a sample that is kept from being charged so much. The pressure of the low vacuum formed in the vicinity of the sample can be varied between several Pa and several thousand Pa by changing a size of the through hole.

The sample replacement chamber 10 and a sample replacement bar 22 are used for a mechanism to have the sample holder 17 put into and taken out of the sample chamber 5 without having the sample chamber 5 exposed to the atmosphere. The sample replacement chamber 10 is connected with piping connected with the rotary pump 14. There is a valve 15 interposed in the piping connected with the sample replacement chamber 10. The sample replacement chamber 17 is exclusively exposed to the atmosphere through the valve 15.

The sample holder 17 is equipped with an attachment 33 as well as a main body. The sample holder 17 is changed without having the sample chamber 5 exposed to the atmosphere through the attachment 17 while making use of the sample replacement chamber 10 and the sample replacement bar 22.

When the sample holder is changed by using the sample replacement bar 22, firstly a height of the sample holder 17 is adjusted by the sample fine movement device 9 so that the attachment 33 is positioned at the same height as an movement axis (corresponding to an alternate long and short dash line in FIG. 1) of the sample replacement bar 22. Secondly the sample replacement bar 22 is moved toward the right in FIG. 1 to become engaged with the attachment 33. Then the sample holder 17 is moved toward the sample replacement chamber 10 by the XY stage and eventually drawn into the sample replacement chamber 10 by the sample replacement bar 22. Subsequently the sample replacement chamber 10 is exposed to the atmosphere after a gate valve 21 is closed and the valve 15 is opened. In this operation a valve 14 interposed in piping connecting the turbo-molecule pump 13 with the rotary pump 14 is kept closed.

Next a structure of the sample holder 17 is explained with reference to FIG. 2, FIG. 3 and FIG. 4.

Figure 2:
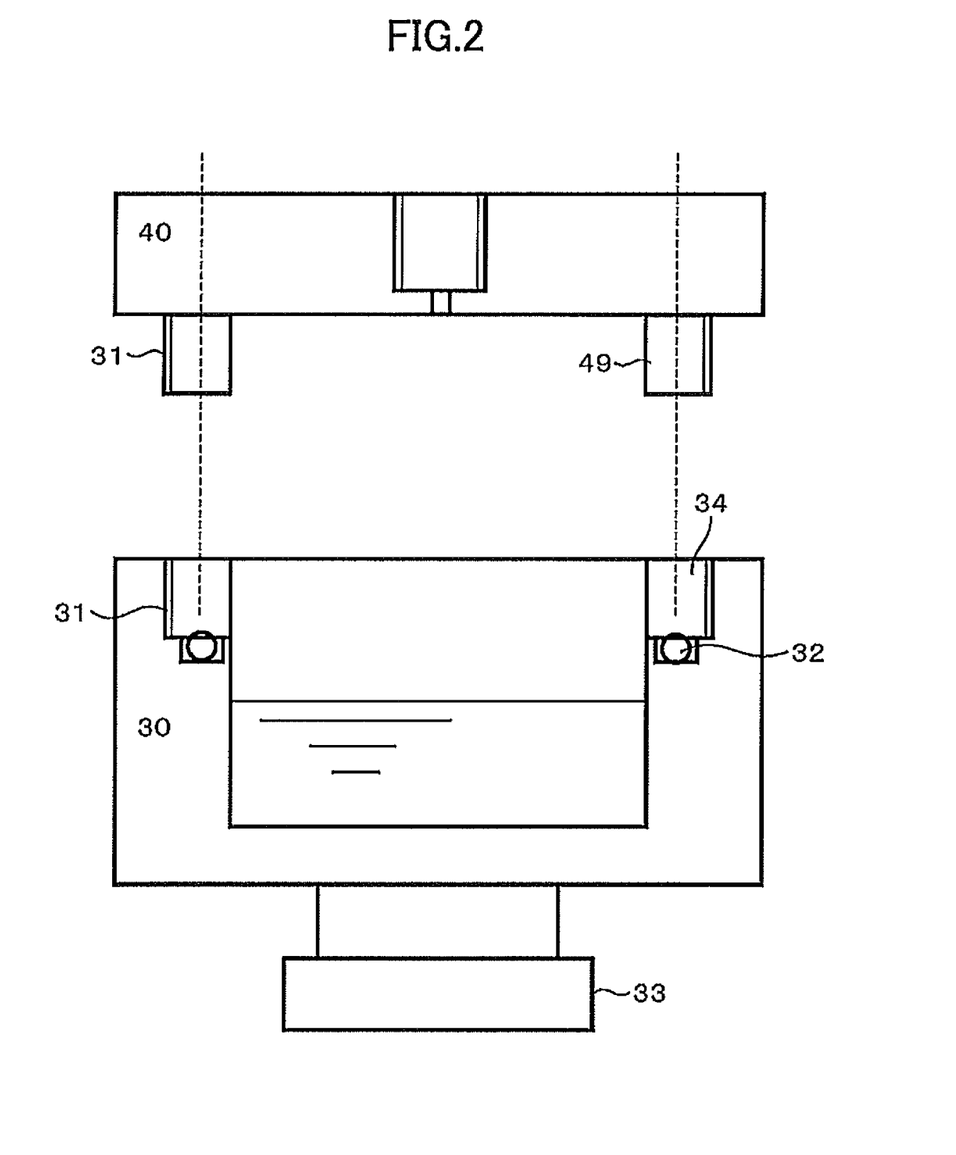
FIG. 2 is a schematic drawing showing a total configuration of a sample chamber.

As is seen in FIG. 2, the sample holder 17 of the present example is roughly constituted by a vessel 30 and a cap (cap member) 40 and a vessel part can be separated from a mounting part of the sample. This separatable structure is intended for having the sample holder repeatedly filled up with the gas source 18 and enabling cleaning an inside of the vessel 30.

The vessel 30 and the cap 40 are both in a columnar shape have shorter heights, and have respectively fitting portions 34, 49 which are fitted to each other. A thread groove 31 is formed on each of an outer circumference face of the fitting portion 49 and an outer circumference face of the fitting portion 34. Accordingly the cap 40 can be taken off the vessel 30 by turning the cap 40.

The vessel 30 has an inside filled up with the gas source 18 and is equipped with an O-ring 32 functioning as a vacuum sealing member when the cap 40 is attached.

Figure 3A:
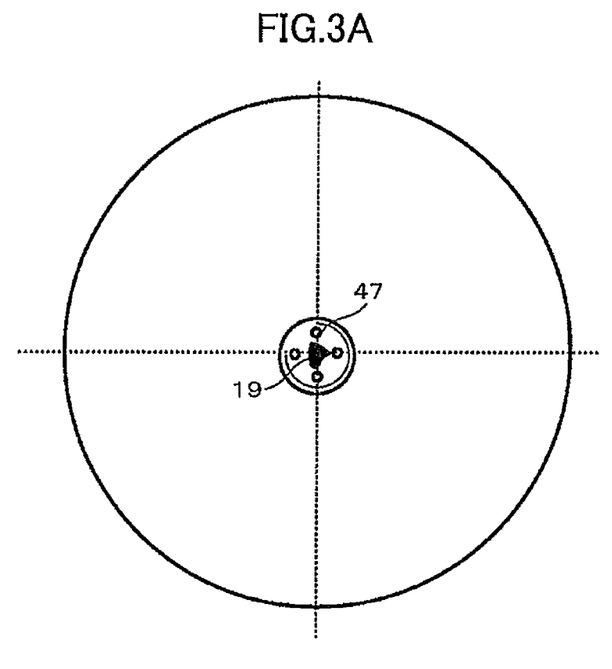
FIG. 3A is a plan view of a cap member.
Figure 3B:
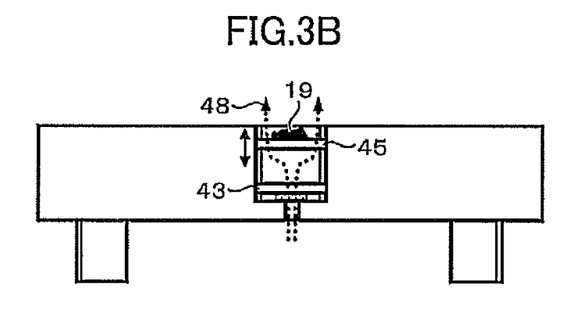
FIG. 3B is a cross-sectional view of the cap member.
Figure 3C:
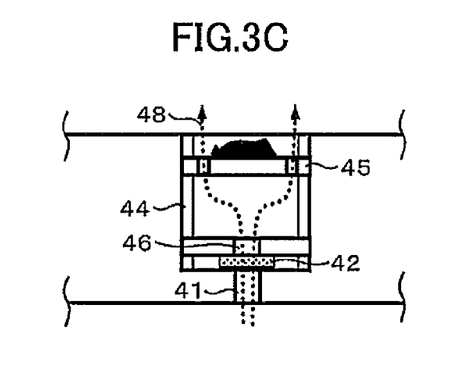
FIG. 3C is an enlarged cross-sectional view of a recessed portion formed in the cap member.
Figure 4:
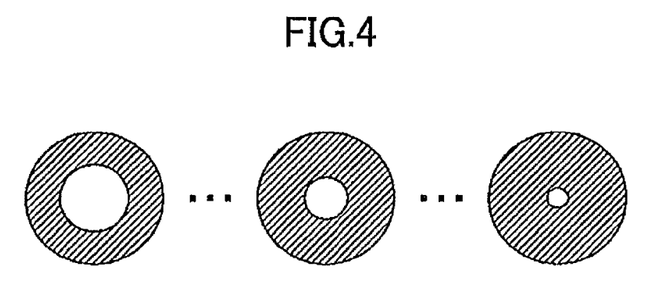
FIG. 4 shows several examples of diaphragms having different hole diameters.

In FIG. 3A to FIG. 3C is shown detail of the structure of the cap 40. FIG. 3A is a plan view of the cap 40. FIG. 3B is a cross-sectional view of the cap 40. FIG. 3C is an enlarged cross-sectional view of a recessed portion formed in the cap 40.

As is seen in FIG. 3B or FIG. 3C, there is a recessed portion formed in a center portion of the cap 40. This recessed portion is a portion on which a sample is placed and at the same time has a gas supply function of supplying to the sample gas coming up from the vessel 30.

There is a through hole 41 formed through a bottom of the recessed portion and the gas coming up from the vessel 30 flows up through the through hole 41. A sample stage 45 is disposed above the through hole 41. There are four holes 47 which are bored through a periphery portion of the sample stage 45 and in communication with the through hole 41. The gas coming up after flowing through the through hole 41 flows up through the holes 47.

Between the sample stage 45 and the through hole 41 is disposed a flow restriction member 42 which is in an annular shape and restricts an amount of the gas supplied through the through hole 41. There is a hole bored through the flow restriction member 42 and a size of the hole is practically between several µm and several mm in diameter. A flow restriction member holder 43 is disposed on the flow restriction member 42 to fix the flow restriction member 42. There is a hole 46 which is disposed in the center portion of the flow restriction member holder 43 and bored through the flow restriction member holder 43. The gas passing through the flow restriction member 42 can flow up through the hole 46.

When a relatively large amount of the gas is allowed to flow, a gas flow rate is adjusted just by changing the diameter of the through hole 41 without using the flow restriction member 42. However, since a diameter of the through hole 41 is invariable after it is produced, it is necessary to prepare plural caps 40 having through holes whose diameters are different from each other in order to change the gas flow rate.

Therefore, the flow restriction member 42 is preferably used although it is not necessarily needed in principle. When plural flow restriction members 42 whose hole diameter are different from each other, as shown in FIG. 4, are prepared in advance, the gas flow rate is varied rather easily by replacing the flow restriction member 42 with a suitable one according to a the vacuum level at which observation is performed.

When a sample 19 is changed to another one to be observed or a flow restriction member 42 is changed to another one, it is necessary to take out the sample stage 45 or the flow restriction member 42 from the recessed portion. In order to do this, a female thread groove 44 is formed on the inner circumference face of the recessed portion while male thread grooves are formed on outer side faces of the sample stage and the flow restriction member holder 43. A going-up-and-down mechanism of the sample stage 45 is intended for an additional function of adjusting an height of the sample 19 in such a way that an uppermost portion of the sample 19 comes at the same height as an upper face of the cap 40 when a sample 19 is changed to another one that has a different height. In addition, there are plural holes (or recesses) which are formed on a peripheral portion of the flow restriction member and other than the hole 46 and the flow restriction member holder 43 can be taken off by putting such a suitable tool as a pair of tweezers into any of the plural holes and turning the flow restriction member holder 43 along on the thread groove. As the sample stage 45 has plural holes 47 bored through as are seen in FIG. 3A, these holes 47 are used to take off the sample stage 45 from the recessed portion.

Other going-up-and-down mechanism than the thread groove may be used and the mechanism making use of the thread groove is most simple for the going-up-and-down mechanism for the sample stage 43 and the flow restriction member holder 46. Alternatively, if the flow restriction member 42 is sized to fit into the recessed portion and has a side face threaded, the flow restriction member holder 43 is not necessary.

As a whole, a gas flow passage 48 as indicated in FIG. 3B and FIG. 3C is formed to have gas flow in the vicinity of a sample therethrough. In this way the vicinity of the sample is kept at a low vacuum with a minimum amount of the gas without gas being externally supplied.

Example 2

Figure 5:
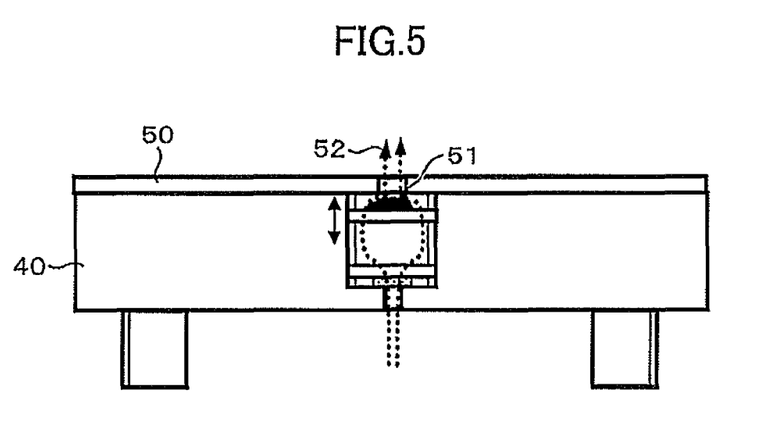
FIG. 5 shows a cap with an upper cover attached.

This example shows a configuration with which the vicinity of the sample 19 is more efficiently kept at a low vacuum. As shown in FIG. 5, an upper cover 50 (second cover member) is attached on an upper face of the cap 40 indicate d in FIGS. 3A, 3B, 3C with screws or the like. There is a center hole 51 which is bored through the upper cover member 50 and has a diameter smaller than a diameter of the sample stage 45 and a diameter of the recessed portion on the cap 40. Since the diameter of the center hole 51 is smaller than the diameter of the sample stage 45, gas that comes up from underneath the sample 19 is prevented from smoothly flowing up above the sample 19. As a result, when the sample 19 is placed in a gas flow passage 52, the vicinity of the sample 19 is kept at a lower vacuum than in the case of the Example 1 if the gas flow rate is the same.

In addition, since the upper cover member has a function of reducing the gas flow rate, the vacuum level in a chamber under the upper cover 50 is kept low and an amount of the gas flowing into the sample chamber is kept smaller as well, which can prevent the vacuum level of the sample chamber 5 from deteriorating.

Figure 6:
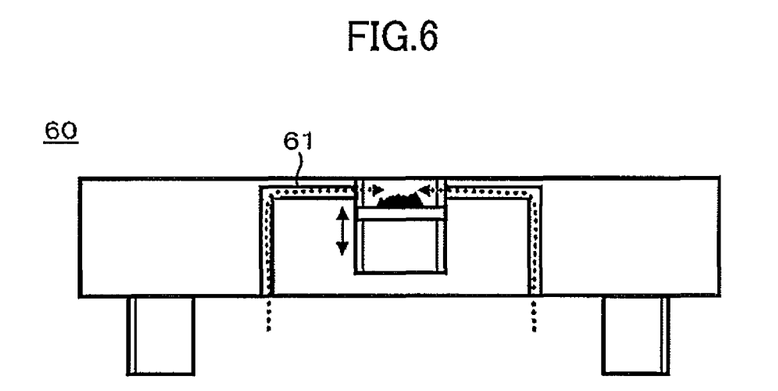
FIG. 6 shows a modified example of the cap.

FIG. 6 shows a modification example of the cap 40. A cap 60 has through holes 61 which are bored horizontally from an inner wall of the cap 60 so that the gas flowing out of the through holes 61 flows toward the sample 19. The cap 60 is effective for such a large sample as extending outside gas flow holes and blocking the gas flowing up from underneath the sample. There ought to be a further advantage of keeping the vicinity of the sample at a lower vacuum because the gas that flows underneath flow directly toward the sample. In addition, if the upper cover 50 as shown in FIG. 5 is attached to the cap 60 as shown in FIG. 6, there ought to be an effect to enable observation on the large sample at a further lower vacuum.

Example 3

Figure 7:
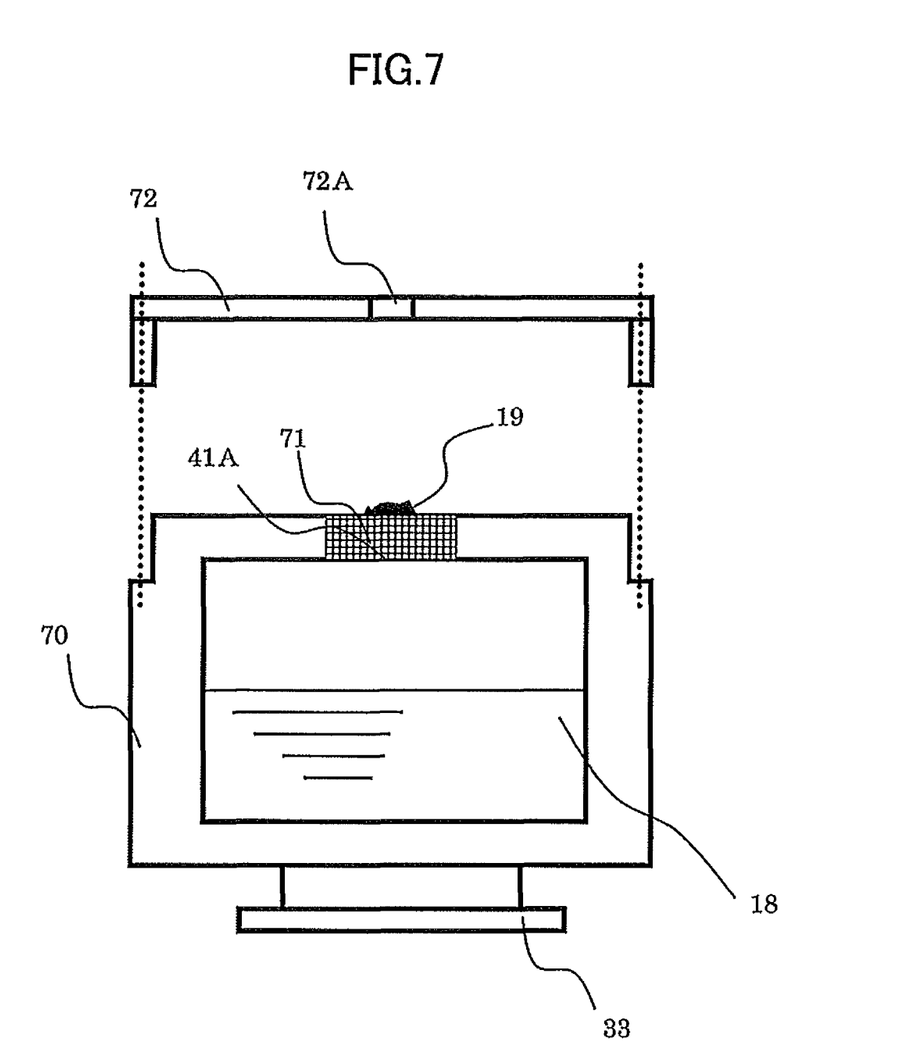
FIG. 7 shows a sample holder of an example of the present invention.

FIG. 7 shows an example of a sample holder of a most simple configuration of the present invention. This example is different from the example 1 in that the vessel is integrated with the cap and more or less the same as the example 1 in the other features. The explanation on the example 3 is given hereinafter by skipping the explanation on the same features as the example 1 has.

In the case of the example 1, the cap 40 is a discrete part separated from the vessel 30 so that the gas source 18 is easily supplied into the vessel 30 while the cap 40 is kept removed from the vessel 30. On the other hand, the vessel and the cap may be integrated into an integrated vessel 70, as is shown in FIG. 7.

There are through holes 41A formed through an upper portion of the integrated vessel 70. Preferably, the through holes 41A may be used not only for a gas passage but also for supplying the gas source 18 so that the gas source 18 such as water may be supplied through the through holes 41A. Alternatively, once a gas source 18 runs out, an integrated vessel 70 including the gas source 18 may be taken off without supplying a new gas source 18 such as water through the through holes 41A and replaced with another integrated vessel 70 including a fresh gas source 18.

It is possible to produce the integrated vessel by casting, welding or other methods. For example, the integrated vessel 70 may be produced by making a couple of parts which are horizontally symmetrical with each other and subsequently welding them, or by making a part of a bottom portion, the other part of the bottom portion, a side portion and an upper portion and subsequently welding them.

The vessel of the present invention may be configured to include a sample stage on which a sample 19 is placed and a mechanism through which gas generated from a substance in the vessel is directed to the sample on the sample stage.

In addition, a mesh 71 in a mesh shape is preferably used for the through holes 41A and the sample 19 is placed on an upper face of the mesh 71. This configuration is capable of making the gas easily introduced directly to the vicinity of the sample 19 and more efficiently keeping the vicinity of the sample 19 locally at a low vacuum.

Furthermore, such an upper cover 72 as capable of having the sample 19 interposed between itself and the upper portion of the integrated vessel 70 may be preferably used. The upper cover 72 has a through hole 72A which comes just above the mesh 71 (that is, above the sample 19) when the upper cover 72 is fitted to the upper portion of the integrated vessel 70. Making use of this upper cover 72 enables efficiently keeping the vicinity of the sample 19 at a low vacuum. The through hole 72A has preferably an opening area smaller than an area of an opening into which the mesh 71 is fitted.

Example 4

Figure 8A:
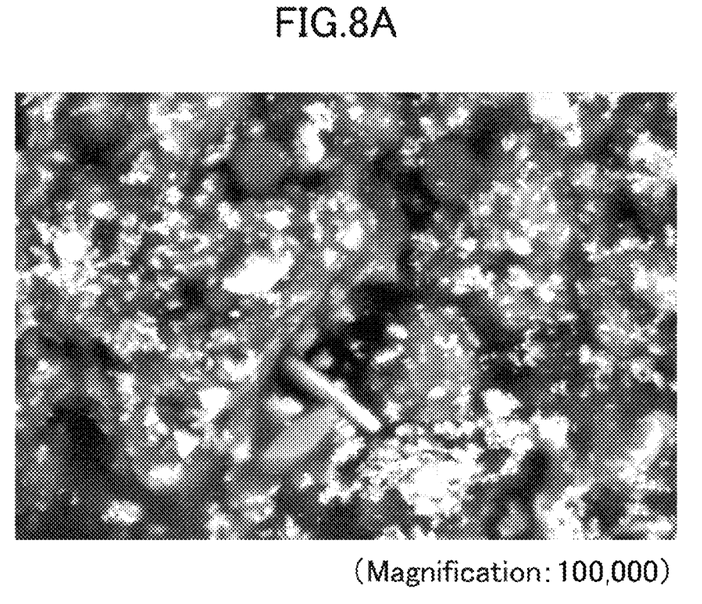
FIG. 8A is a photo of a SEM backscattered electron image which was taken of sunscreen cream using a sample holder of the present invention.
Figure 8B:
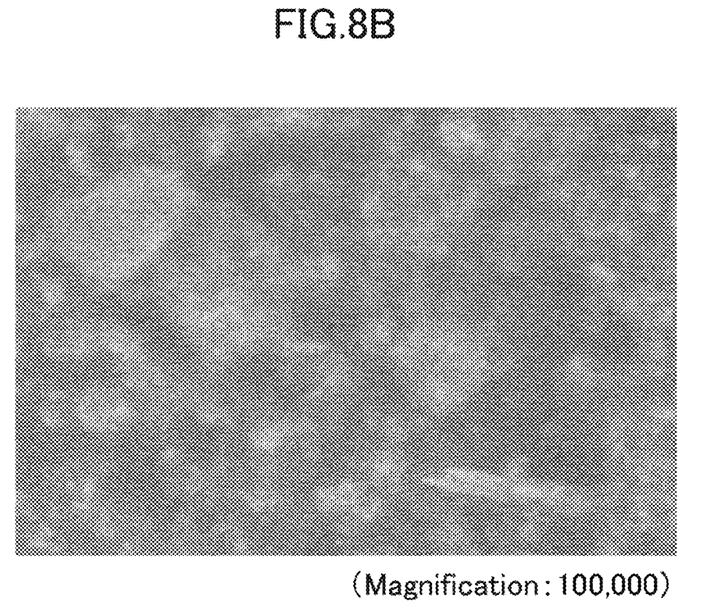
FIG. 8B is a photo of a SEM backscattered electron image which was taken of the sunscreen cream without using a sample holder of the present invention.

FIG. 8A and FIG. 8B show SEM backscattered electron image photos which were taken of sunscreen cream used as a sample. The SEM backscattered electron image photo in FIG. 8A was taken using the sample holder 17 while the SEM backscattered electron image photo in FIG. 8B was taken without using the sample holder 17. Both of the SEM backscattered electron image photos in FIG. 8A and FIG. 8B were taken of the sunscreen cream in the vicinity of which the pressure was kept at 300 Pa. When the sample holder 17 was used (FIG. 8A), the internal pressure in the sample chamber was kept at 150 Pa which was relatively low due to the effect of the sample holder 17. In this case, the electron beam was not scattered much and a surface structure of the sample was clearly observed. However when the sample holder 17 was not used (FIG. 8B), the internal pressure in the sample chamber was kept at 300 Pa which was relatively high. In this case the electron beam was scattered so much that the surface structure of the sample was not clearly observed.

Figure 9:
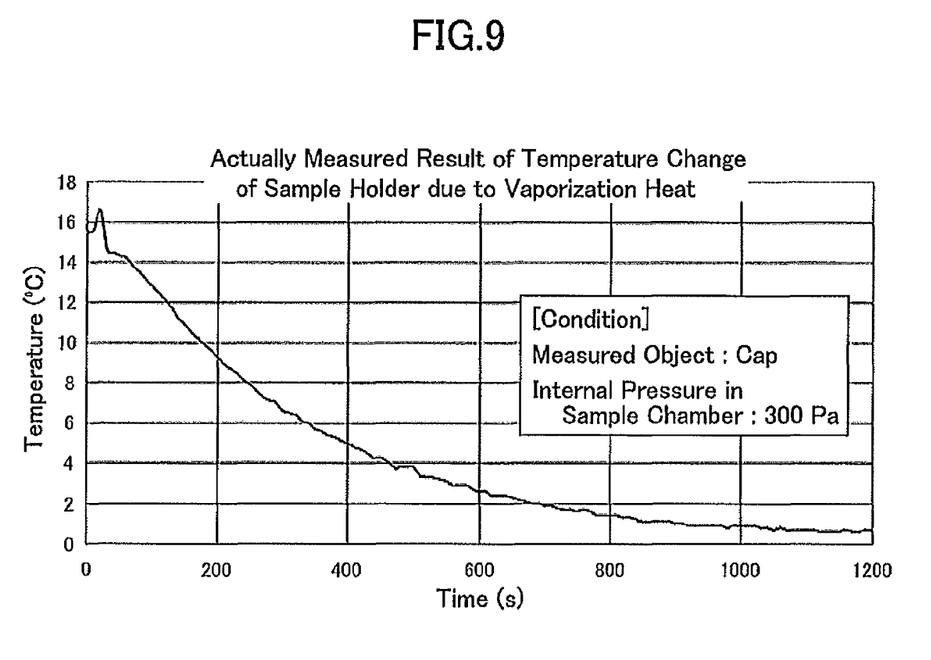
FIG. 9 shows an actually measured result of temperature change of a sample holder of the present invention.
Figure 10:
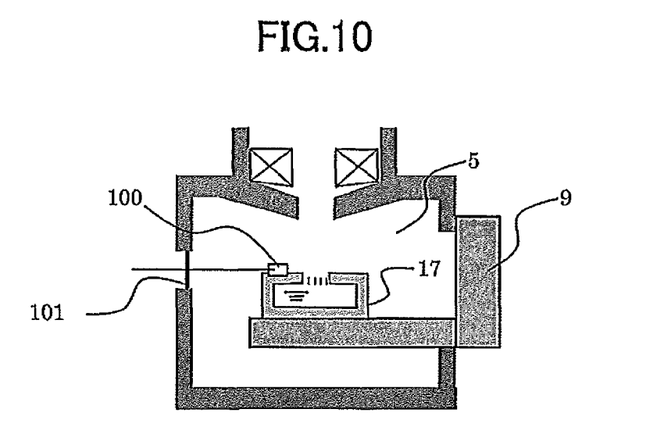
FIG. 10 shows how the temperature change of the sample holder is performed.

Making use of the configuration of the present invention enables not only keeping the vicinity of the sample locally at a low vacuum but also cooling the sample simultaneously. FIG. 9 shows an actually measured result of temperature change of a sample holder of the present invention when the sample holder 17 is placed in the sample chamber 5 whose inner pressure is kept at 300 Pa. FIG. 10 shows how the temperature change of the sample holder is performed. The temperature of the sample holder 17 was measured with a temperature sensor 100 placed on the upper portion of the sample holder 17. The temperature sensor 100 was connected through a feed-through 101. The sample holder 17 is cooled in the following way. When water kept inside the sample holder 17 vaporizes as a pressure inside the sample chamber is being decreased, the entire sample holder 17 is cooled by the vaporization of the water.

The measured result in FIG. 9 indicates that the temperature of the sample holder 17 lowered approximately from 16° C. approximately to 1° C. over about 1000 seconds.

A saturation vapor pressure at 1° C. is approximately 660 Pa. The pressure in the vicinity of the sample 19 is adjusted to the saturation vapor pressure by appropriately changing diameters of the flow restriction member 42 and the center hole 51. As a result of this adjustment, the electron beam can be radiated with a minimum level of scattering and at the same time the sample is dried as light as possible.

Figure 11A:
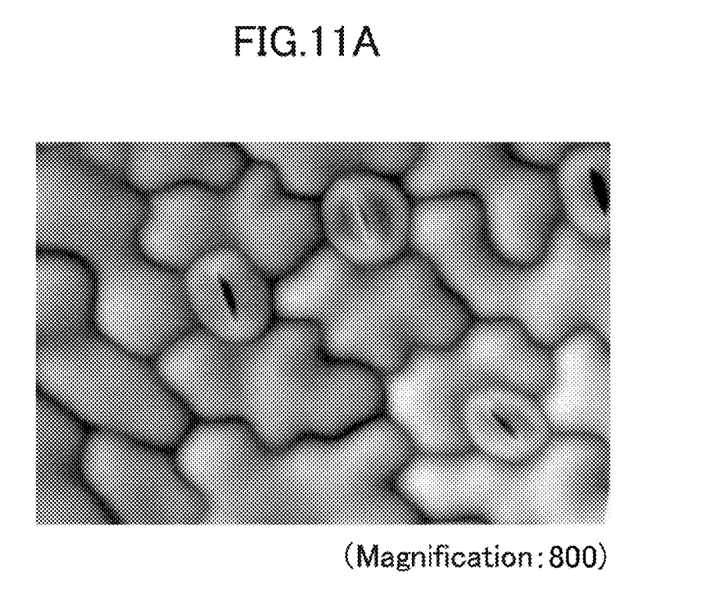
FIG. 11A is a photo of a SEM backscattered electron image which was taken a leave of a plant as a sample taken using a sample holder of the present invention.
Figure 11B:
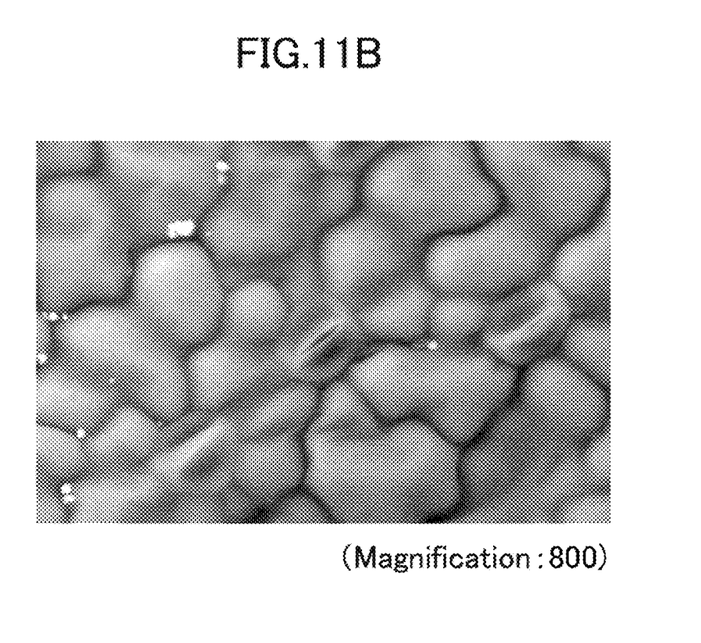
FIG. 11B is a photo of a SEM backscattered electron image which was taken of the leave of the plant as a sample without using a sample holder of the present invention.

FIG. 11A and FIG. 11B show SEM backscattered electron image photos which are taken of a leave of a plant used as a sample. The SEM backscattered electron image photo in FIG. 11A is taken using the sample holder 17 while the SEM backscattered electron image photo in FIG. 11B is taken without using the sample holder 17. Both of the SEM backscattered electron image photos in FIG. 11A and FIG. 11B are taken with the internal pressure in the sample chamber kept at 300 Pa. When the sample holder 17 is used (FIG. 11A), a surface texture of the leave is seen with water contained in the leave having not vaporized due to the effect of the sample being cooled and kept locally at a low vacuum. In this experiment, the pressure in the vicinity of the sample is increased to 600 Pa.

On the other hand, when the sample holder 17 is not used (FIG. 11B), the observed leave has a surface texture crushed after water contained in a surface portion of the leave vaporized. Looking at these SEM backscattered electron image photos, it is obvious that the sample holder 17 has an advantageous effect.

Figure 12:
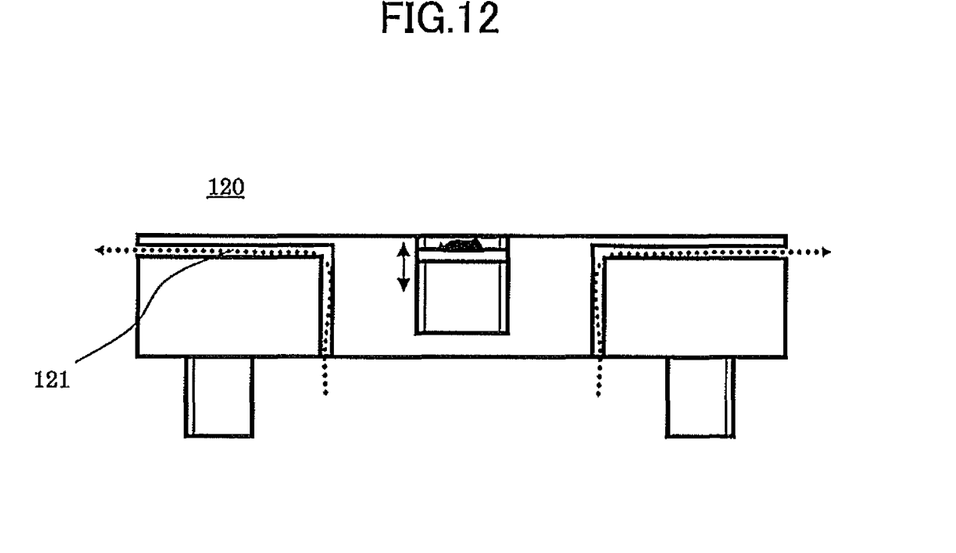
FIG. 12 is a drawing showing a configuration of an example of a cap dedicated to cooling.

FIG. 12 shows a modification example of the cap 60. A cap 120 has a through hole bored through to the outside of the sample holder 17 and water vapor is discharged through the through hole 121. If the sample does not need to be kept locally at a low vacuum and needs to be cooled, the cap 120 is effectively used.

INDICATION OF SIGNS

1 Scanning Electron Microscope
2 Electron Gun
3 Focusing Lens Chamber
4 Objective Lens Chamber
5 Sample Chamber
6 Electron Source
7 Focusing Lens
8 Objective Lens
9 Sample Fine Movement Device
10 Sample Replacement Chamber
11, 12 Ion Pump
13 Turbo-molecular Pump
14 Rotary Pump
15, 16 Valve
17 Sample Holder
18 Gas Source
19 Sample
22 Sample Replacement Bar
30 Vessel
31, 44 Thread Groove
32 O-ring
33 Attachment
40, 60 Cap
41, 41A, 61, 121 Through Hole
42 Flow Restriction Member
43 Flow Restriction Member Holder
45 Sample Stage
46, 47 Hole
48, 52 Gas Flow Passage
50, 72 Upper Cover
51 Center Hole
70 Integrated Vessel
71 Mesh
100 Temperature Meter
101 Feed-through

What is claimed is:

1. A sample holder for an electron microscope for radiating an electron beam on a sample that is placed in a vacuum sample chamber and taking an image of the sample, the sample holder is disposed within the vacuum chamber, the sample holder comprising,
   a vessel in which a substance for a gas source is stored;
   a sample stage on which the sample is disposed;
   a communication hole to supply gas generated from the substance to the sample on the sample stage; and
   a first cap member covering and sealing the vessel to maintain a vacuum state having a recess portion formed on an upper side of the first cap member,
   wherein the sample stage is disposed in the recessed portion,
   wherein the first cap member has a through hole, supplying gas generated from the substance to the sample, bored through a bottom of the recess portion having a diameter smaller than an inner diameter of the recess portion and is a part of the communication,
   wherein a flow restriction member is disposed inside the recess portion, in the through hole, and below the sample stage,
   wherein a flow restriction member holder is provided for fixing the flow restriction member at a predetermined position in the recess portion, and
   wherein a through hole is bored through the flow restriction member through which the gas flows.

2. The sample holder for the electron microscope as described in claim 1, wherein the flow restriction member is an annular shaped plate through which the through hole is bored.

3. The sample holder for the electron microscope as described in claim 2, wherein the flow restriction member is removable, and
   wherein another flow restriction member may be disposed inside the recess portion that has a through hole having a diameter different from a diameter of the flow restriction member.

4. The sample holder for the electron microscope as described in claim 1, further comprising a going-up-and-down mechanism to have the sample stage or the flow restriction member go up and down in the recess portion.

5. The sample holder for the electron microscope as described in claim 4, wherein the going-up-and-down mechanism constituted by a first thread groove formed on a periphery portion of the sample stage or the flow restriction member and a second thread groove formed on an inner wall face of the recess portion.

6. The sample holder for the electron microscope as described in claim 1, further comprising a second cap member capable of being attached on an upper face of the first cap member, the second cap member having a through hole bored of which a diameter is smaller than a diameter of the sample stage.

7. The sample holder for the electron microscope as described in claim 1, further comprising an attachment capable of being directly attached to a sample fine movement device of the electron microscope.

8. The sample holder for the electron microscope as described in claim 1, when the vessel is in a vacuum state, the sample is cooled by vaporization of the gas source in the vessel.

9. An electron microscope, comprising;
   a vacuum sample chamber in which a sample is disposed;
   an electronic optical lens barrel having a lens focusing an electron beam on a sample;
   a detector for detecting secondary electrons or backscattered electrons which are obtained by radiating the electron beam; and
   a sample holder disposed in the vacuum sample chamber, the sample holder comprising:
      a vessel in which a substance for a gas source is stored;
      a first cap member covering and sealing the vessel to maintain a vacuum state having a recess portion formed on an upper side of the first cap member; and
      a communication hole to supply gas generated from the substance to the sample on a sample stage,
   wherein the sample stage on which a sample is disposed is disposed in the recessed portion of the first cap member,
   wherein the first cap member has a through hole, supplying gas generated from the substance to the sample, bored through a bottom of the recess portion having a diameter smaller than an inner diameter of the recess portion and is a part of the communication,
   wherein a flow restriction member is disposed inside the recess portion, in the through hole, and below the sample stage,
   wherein a flow restriction member holder is provided for fixing the flow restriction member at a predetermined position in the recess portion, and
   wherein a through hole is bored through the flow restriction member through which the gas flows.

10. A sample observation method for observing a sample by radiating an electron beam on the sample disposed in a vacuum chamber, detecting secondary electrons or backscattered electrons generated from the sample and imaging the sample from the detected electrons, the sample observation method comprising:
  providing a first cap member covering and sealing a vessel, in which a substance for a gas source is stored, to maintain a vacuum state having a recess portion formed on an upper side of the first cap member;
  providing a communication hole to supply gas generated from the substance to the sample on a sample stage;
  providing the sample stage in the recessed portion;
  supplying gas generated from the substance to the sample through a through hole of the first cap member bored through a bottom of the recess portion having a diameter smaller than an inner diameter of the recess portion and is a part of the communication,
  providing a flow restriction member disposed inside the recess portion, in the through hole, and below the sample stage, wherein a through hole is bored through the flow restriction member through which the gas flows;
  providing a flow restriction member holder for fixing the flow restriction member at a predetermined position in the recess portion; and
  creating a local low vacuum condition locally at a position of the sample on the sample stage by vaporizing the substance in the vessel through a pressure inside the vacuum chamber and supplying gas generated from the substance to the sample on the sample stage through the communication hole; and
  imaging the sample by radiating an electron beam on the sample and detecting secondary electrons or backscattered electrons generated from the sample.

* * * * *